(12) United States Patent
Sako

(10) Patent No.: US 6,594,097 B1
(45) Date of Patent: Jul. 15, 2003

(54) REPRODUCTION AMPLIFIER CIRCUIT OF HARD DISK DRIVE

(75) Inventor: Michiya Sako, Kagoshima (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/515,709

(22) Filed: Feb. 29, 2000

(30) Foreign Application Priority Data

Mar. 1, 1999 (JP) ............................................ 11-052442

(51) Int. Cl.[7] .............................................. G11B 15/12
(52) U.S. Cl. .............................. 360/63; 360/61; 360/66
(58) Field of Search ............................... 360/61, 62, 63, 360/66, 46, 67

(56) References Cited

U.S. PATENT DOCUMENTS 5,623,378 A * 4/1997 Shibasaki et al. ............. 360/67
6,208,482 B1 * 3/2001 Araya et al. ................... 360/67

* cited by examiner

*Primary Examiner*—Alan T Faber
(74) *Attorney, Agent, or Firm*—Rader, Fishman & Grauer PLLC; Ronald P. Kananen, Esq.

(57) ABSTRACT

The overvoltage applied on a head during switching of the head is prevented. At the time when the head switching signal changes, a switch S4 for turning on/off an operational amplifier Gm1 is turned off, and the operational amplifier Gm1 is turned off. Simultaneously, the switch S3 is turned on, the current source I1 is connected to a capacitor C1, and the capacitor C1 is discharged. Then, switches S1 and S2 for switching the MR head are switched. Finally, the switch S3 is turned off and the switch S4 is turned on, thus the switching of the MR head is finished.

7 Claims, 4 Drawing Sheets

REPRODUCTION AMPLIFIER CIRCUIT OF HARD DISK DRIVE

BACKGROUND OF THE INVENTION

1. Field of the Invention

This invention relates to a reproduction amplifier circuit of a hard disk drive, and more particularly relates to a reproduction amplifier circuit of a hard disk drive having a MR (Magneto Resistive) head.

2. Description of Related Art

In the field of the head of the reproduction amplifier circuit of the hard disk drive (referred to as HDD hereinafter), the MR head having an MR element which utilizes resistance change depending on the magnitude of the magnetic field has mainly been used.

A conventional reproduction amplifier circuit of an HDD having a MR head is described herein under. FIG. 3 is a conventional circuit diagram of a reproduction amplifier circuit of an HDD having a MR head. This HDD reproduction amplifier circuit is a Voltage Bias Current Sensing type reproduction amplifier circuit in which a signal is taken out as a current while both end voltage of the MR is being fixed.

Because both face side and back side of a disc of an HDD are served for recording, two MR heads MR0 and MR1 are used for one disc. Because all the discs are recorded/reproduced by use of one circuit in the reading/writing amplifier, change-over switches S1 and S2 are provided for selecting an MR head.

When the MR head MR0 is selected, the switch S1 is connected to the terminal a side and switch S2 is connected to the terminal c side, an inverted input (−) of an operational amplifier Gm1 is connected to the MR0 and the output is connected to the base of a transistor Q2. In such a circuit as described herein above, the operational amplifier functions so that a voltage V1 generated in the internal is generated at the H0 terminal. A capacitor C1 is provided to remove the noise of the operational amplifier Gm1. When the resistance value of the MR0 changes in response to the change of magnetic field on the hard disk in this state, the change is transmitted to the resistor R1 as a current. The operational amplifier A1 amplifies the current corresponding to the change and sends it out to an output terminal V0. As described herein above, the MR head MR0 performs reproduction process.

In the case that the MR head MR1 is selected, the MR head MR1 performs reproduction processing in the same manner as described herein above. The switch S1 is connected to the terminal b and the switch 2 is connected to the terminal d, the inverted input (−) of the operational amplifier Gm1 is connected to the MR1 and the output is connected to the base of a transistor Q1. In such a circuit as described herein above, the operational amplifier Gm1 functions so that a voltage V1 generated in the internal is generated at the H1 terminal. When the resistance value of the MR1 changes in response to the change of magnetic field on the had disc in this state, the change is transmitted to the resistor R1 as a current. The operation amplifier A1 amplifies the current corresponding to the change and sends it out to the output terminal V0. As described herein above, the MR head MR1 performs reproduction process.

The switches S1 and S2 are switched simultaneously usually. By switching the switches S1 and S2 simultaneously, when, for example, a switching signal of the head is changed from the MR0 to MR1, the switches S1 and S2 are switched and V1 is generated at the H1 terminal of the MR1.

The conventional reproduction amplifier circuit of an HDD having an MR head described herein above is disadvantageous in that an overvoltage is applied to the MR head when the MR head is switched.

In switching of the MR head, for example, when the MR head MR0 is switched to the MR head MR1, an MR head switching signal is transmitted simultaneously to the switch S1 and switch S2, but parasitic capacitance and wiring resistance cause a switching lag between these switches S1 and S2.

FIG. 4 is a timing chart of a conventional reproduction amplifier circuit of an HDD having an MR head. The operation performed when the switch S1 is switched with a delay of the time t3 from the switch S2 is described. When the switching signal of the head changes from the H0 terminal to the H1 terminal, first the switch S2 is switched from the terminal c to the terminal d. During the time t3 until the switch S1 is switched, the voltage of the H1 terminal namely the GND voltage value is connected to the inverted input (−) of the operational amplifier Gm1, and the operational amplifier Gm1 functions to increase the voltage at the A point. During the time, the voltage generated at the H1 terminal is remained in GND. The switch S1 is switched from the terminal a to the terminal b with the delay of the time t3. At the time when the switch S1 is switched, the voltage increased by the operational amplifier Gm1 as described herein above is applied to the H1 terminal. After that time, the operational amplifier Gm1 functions to adjust the voltage of the H1 terminal to V1, and the voltage of the H1 terminal decreases gradually to V1 and this state is maintained. As described herein above, when the switch S1 delays from the switch S2, an overvoltage is applied to the MR head MR1, this is a problem.

The case in which the switch S2 delays from the switch S1 by the time t3 will be described herein under. When the switch S1 is switched, a voltage V1 is generated at the H1 terminal of the MR1. During the time t3 until the time t3 elapses, the switch S2 is not switched, and the H0 terminal which is now going to decrease to GND is connected to the inverted input (−) of the operational amplifier Gm1. Because a voltage which is lower than the non-inverted input terminal (+) is applied to the inverted input (−) of the operational amplifier Gm1 as described herein above, the operational amplifier Gm1 functions to increase the voltage at the A point similarly to the case that the switch S1 is switched with a delay as described herein above. As the result, an overvoltage is applied to the MR head MR1 also when the switch S2 delays from the switch S1.

As described herein above, regardless of the switch that is first switched, when switching causes a lag between the switches S1 and S2, an overvoltage is applied to the MR head to cause the reduction of the reliability of the MR head.

The present invention was accomplished to solve such problem. It is the object of the present invention to provide a reproduction amplifier circuit of a hard disk drive in which an overvoltage is not applied to a head when the head is switched.

SUMMARY OF THE INVENTION

To solve the above-mentioned problem, the present invention provides a reproduction amplifier circuit of a hard disk drive for reproducing the information recorded in the predetermined disc area by use of two MR (Magneto Resistive) heads comprising an MR head switching means for performing switching of the MR head connected to a negative feedback circuit for applying a predetermined voltage on the MR head in response to a head switching signal, first switching means for turning off the operation of an amplifier which forms the negative feedback circuit for a predetermined time, a current source for discharging a capacitor provided on the middle of the negative feedback circuit, and second switching means for turning on the connection between the current source and the capacitor in response to the off operation of the first switching means.

The reproduction amplifier circuit of the hard disk drive having the structure as described herein above fixes both end voltage of the MR head by means of the negative feedback circuit, and reads out (reproduces) the disc by means of the change in resistance value of the MR head depending on the change in magnetic field on the disc. The MR head switching means switches the MR head comprising two heads per one disc, and reproduces a desired disc area. Before the MR head is switched by means of the MR head switching means, the operation of the operational amplifier which forms the negative feedback circuit is turned off by use of the first switching means, and the function of the negative feedback circuit is inactivated until the switching of the MR head is completed. At that time, the second switching means connects the capacitor to the current source, and the capacitor is thereby discharged. Subsequently, the MR head is switched by the MR head switching means, the state of the first switching means and the second switching means is restored to the original state, and the operation of the negative feedback circuit is activated again.

DETAILED DESCRIPTION OF THE PREFERRED EMBODIMENTS

Figure 1:
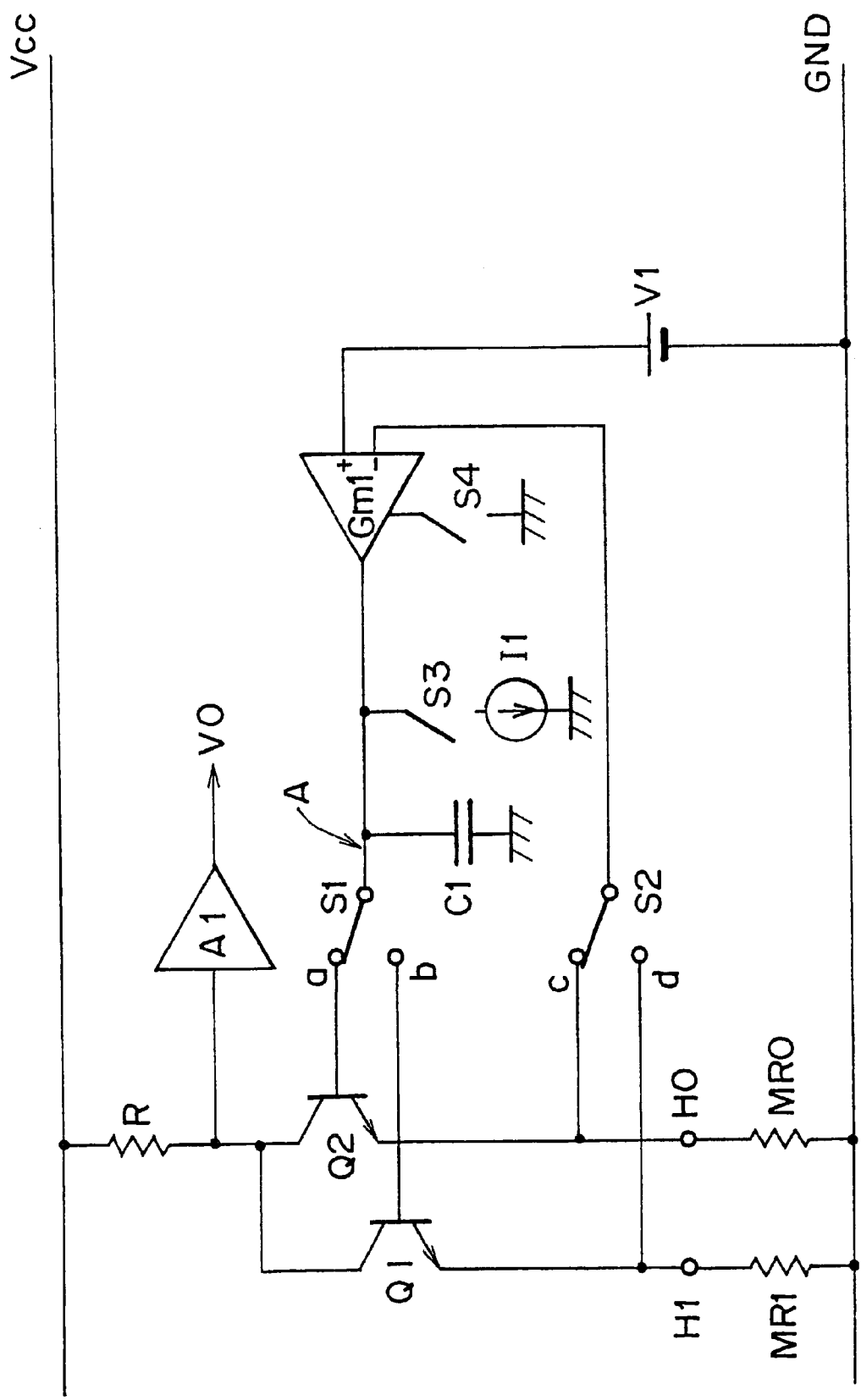
FIG. 1 is a circuit diagram of a reproduction amplifier circuit of an HDD having an MR head in accordance with an embodiment of the present invention.

An embodiment of the present invention will be described in detail hereinafter with reference to the drawings. FIG. 1 is a circuit diagram of a reproduction amplifier circuit of an HDD having an MR head in accordance with an embodiment of the present invention.

In the reproduction amplifier circuit of the HDD in accordance with the present invention, a power source V1 is connected to a non-inverted input terminal (+) of an operational amplifier Gm1, an H0 terminal or the H1 terminal of an MR head MR0 or MR1 selected by a switch S2 is connected to an inverted input terminal (−), and the output of the operational amplifier Gm1 is connected to the base of a transistor Q2 or Q1 connected to the MR head MR0 or MR1 selected by a switch S1. These connections form a negative feedback circuit for controlling both end voltages of the MR heads MR0 and MR1 to a predetermined value. The operational amplifier Gm1 can be on/off by on/off switching of a switch S4. A capacitor C1 for removing the output noise of the operational amplifier Gm1 and a current source I1 for discharging the capacitor C1 are connected on the middle of the path of the feedback circuit by way of a switch 3. The transistors Q1 and Q2 are connected to a resistor R1 and an operational amplifier A1, and a current transmitted to the resistor R1 in response to the change in resistance value of the MR1 or MR2 is amplified by the operational amplifier A1 and taken out by the output terminal V0.

The switches S1 and S2 are an MR head switching means for switching the MR head, and operate linkedly. When the MR0 is selected, the switch S1 is connected to the terminal a and the switch S2 is connected to the terminal c side.

The switch S4 is the first switching means for turning off the operation of the operational amplifier Gm1 which forms the negative feedback circuit for a predetermined time, and when the change of the head switching signal is detected, the switch S4 turns off the operational amplifier for a predetermined time t1. The operational amplifier is ON ordinarily.

The switch S3 is the second switching means for turning on/off the connection of the current source I1, operates with the switch 4. While the switch S4 is being OFF, the switch S3 is being ON to connect the current source I1 to the capacitor C1 for discharging of the capacitor C1. The switch S3 is OFF ordinarily.

Figure 3:
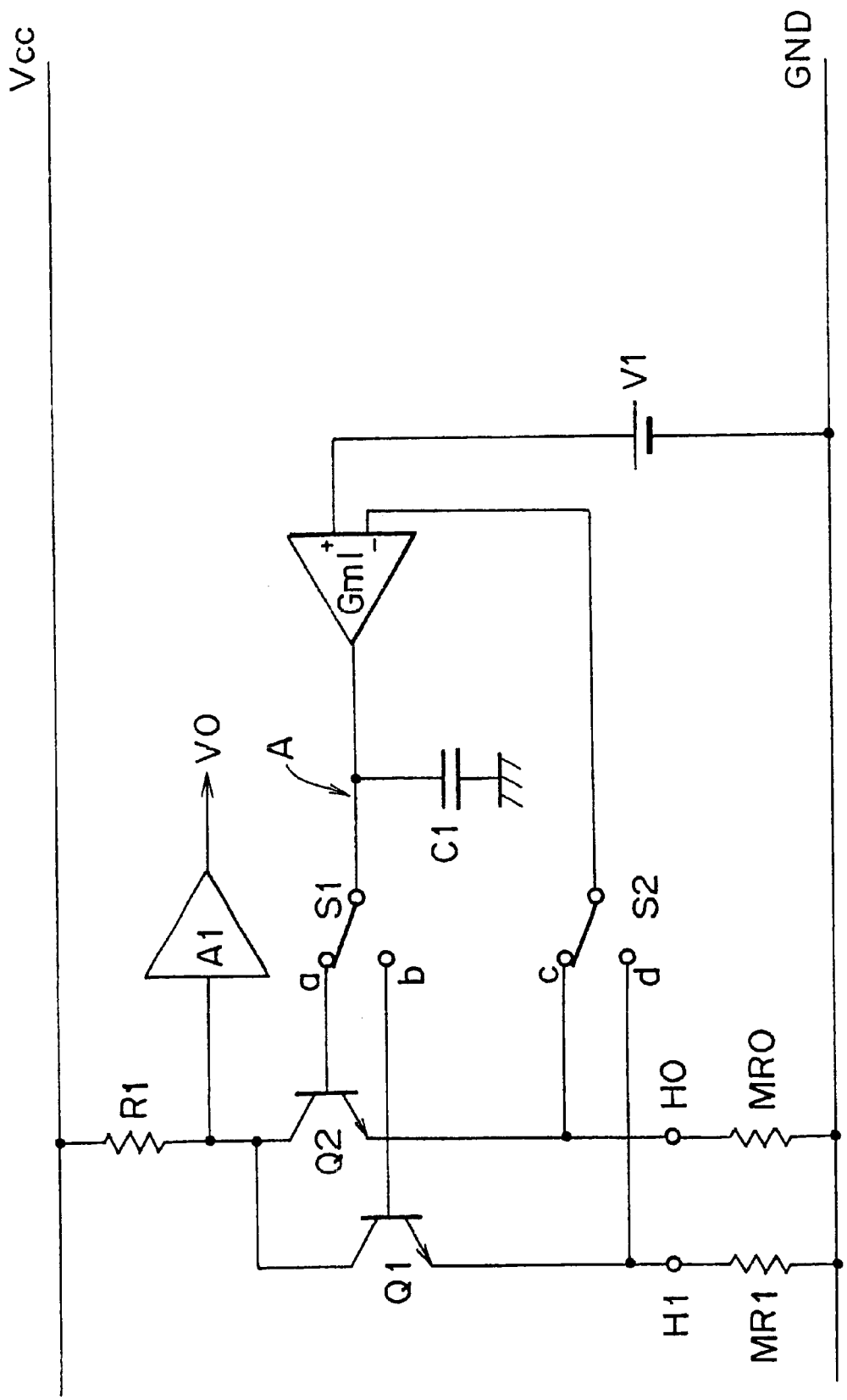
FIG. 3 is a conventional circuit diagram of an reproduction amplifier circuit of an HDD having an MR head.
Figure 4:
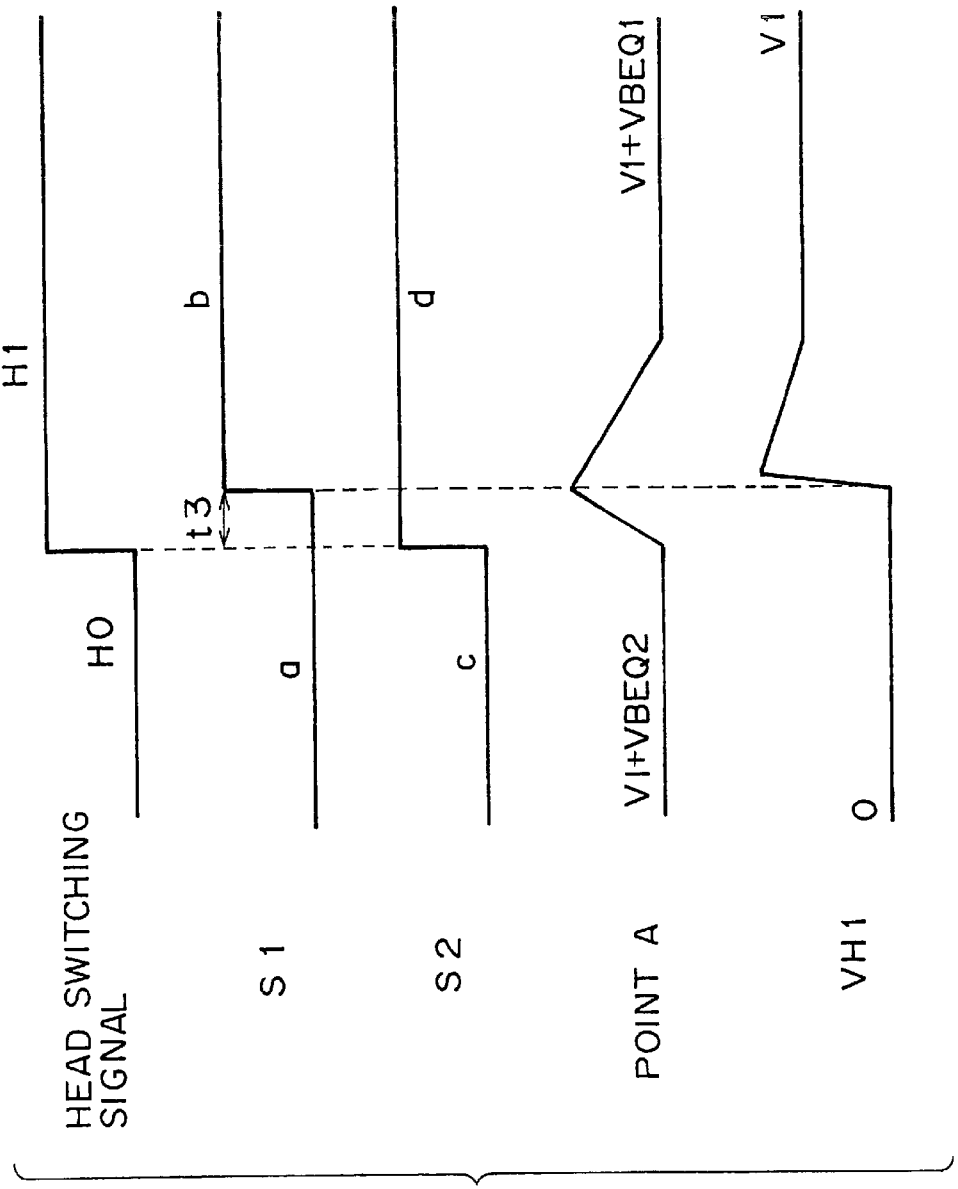
FIG. 4 is a timing chart of the conventional reproduction amplifier circuit of the HDD having the MR head.

As described herein above, the switch S3 is OFF and the switch S4 is ON ordinarily. In this state, the circuit operation equivalent to the ordinary state described with reference to FIG. 3 is performed. Therefore, the description of the ordinary operation is omitted.

Figure 2:
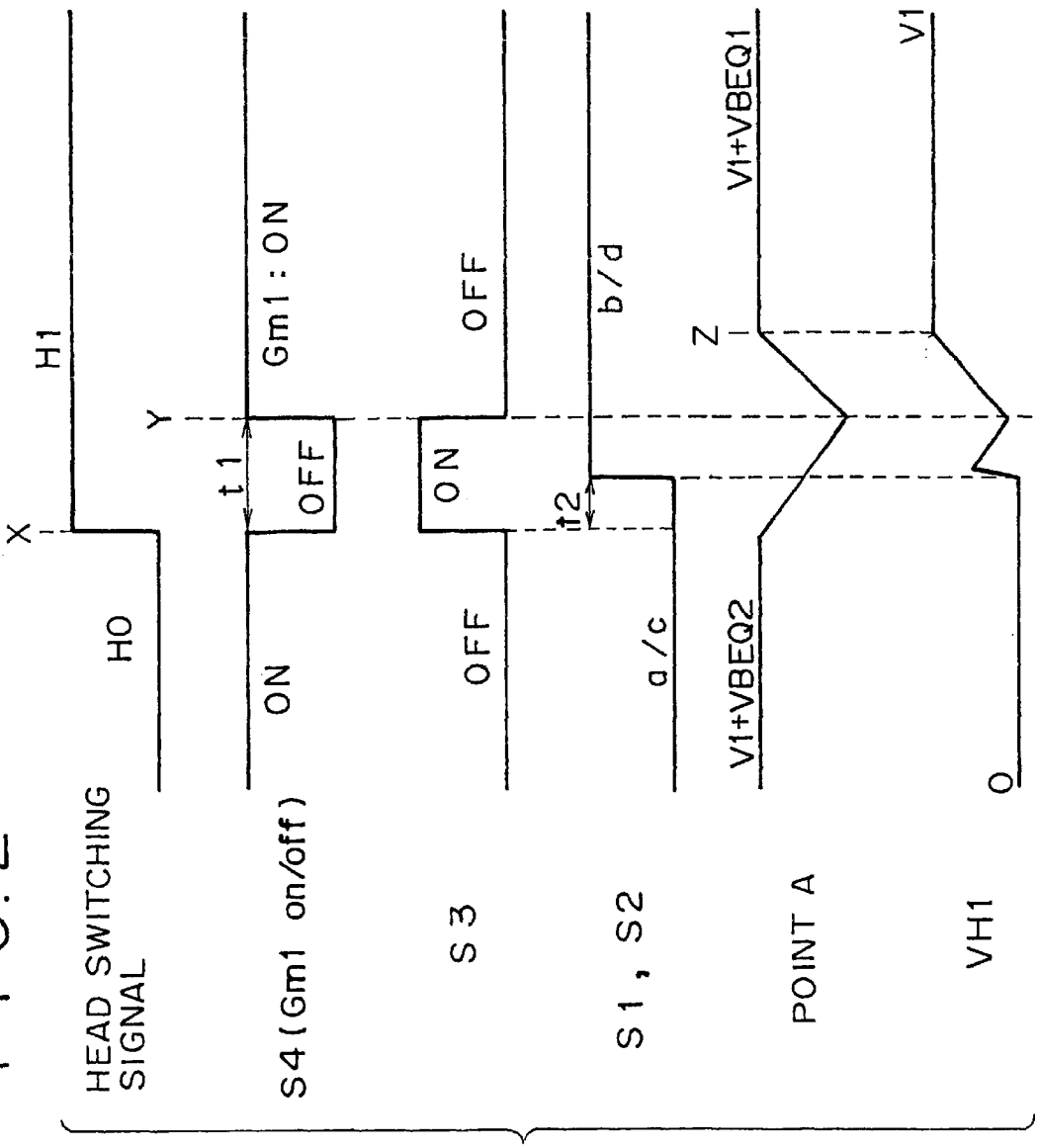
FIG. 2 is a timing chart of the reproduction amplifier circuit of the HDD having the MR head in accordance with the embodiment of the present invention.

Next, the operation performed when the head is switched in the reproduction amplifier circuit of the hard disk drive having the structure as described herein above is described. FIG. 2 is a timing chart of the reproduction amplifier circuit of the HDD having the MR head in accordance with the embodiment of the present invention. Herein, switching of the MR head from the MR0 to MR1 is described.

The head switching signal is switched from the H0 terminal (MR0 is selected) to the H1 terminal L (MR1 is selected). This switching time point is represented by X. X is the starting point of head switching operation. At the time when the head switching signal is changed, the switch S4 for turning on/off the operational amplifier Gm1 is turned off and the operational amplifier Gm1 is turned off. This operation is performed to prevent the rising of voltage at the A point because the voltage at the A point is increased if the MR head is switched while the operational amplifier is being maintained active. Simultaneously, the switch S3 for connecting the current supply source I1 to the capacitor C1 is turned on, the current source I1 is connected to the capacitor C1, and the capacitor C1 is discharged. By lowering the charge of the capacitor C1, the potential of the A point is lowered. As described herein above, the potential of the A point lowers gradually from the head switching signal change time point (X). In this state, the voltage VH1 of the MR1 side terminal H1 is GND because the switch S1 and the switch S2 for switching the MR head continue to select the MR0.

With delay of the time t2 from X, the switches S1 and S2 for switching the MR head perform a switching operation. The switch S1 is switched from the terminal a to the terminal b and the switch S2 is switched from the terminal c to the terminal d. At that time, a voltage which is VBE lower than the voltage is generated at the H1 terminal, the potential of the H1 terminal follows the potential of the A point until the off time t1 of the operational amplifier Gm1 elapses.

When the time t1 elapses from X, the switch S4 which has maintained the operational amplifier Gm1 OFF is turned on. This time point is represented by Y. Simultaneously, the switch S3 which has connected the current source I1 to discharge the capacitor C1 is turned off, and the current source I1 is disconnected. In this state, the MR head has been switched to the MR1 head, and the operational amplifier Gm1 starts to function to equalize the voltage of the terminal H1 to V1. Thereby, the potential of the A point and VH1 increase gradually until the potential is equalized to V1, and the potential is thereafter maintained at V1. The time point when the voltage of VH1 is equalized to V1 is represented by Z.

As described herein above, the time lag is set to change over switches so that the voltage at the A point which determines the voltage of the MR head does not increase and the operational amplifier Gm1 is not operated during switching of the MR head during the time period from the time X when the head switching signal is changed to the time Y when the operation amplifier Gm1 starts operation after completion of the head switching. As the result, the overvoltage applied on the MR head during switching is prevented.

The time from X to Z is the time required for switching the MR head. The time from X to Z is determined by setting the time t1 and t2 so that the required specification of the HDD is satisfied. In the above-mentioned description, t2<t1 is assumed, but t2=t1 may be used.

As described herein above, in the present invention, when the MR head is switched, the operation of the operational amplifier which forms the negative feedback circuit is turned off and the capacitor is discharged before the switching is performed. Subsequently, the MR head is switched, the operation of the operational amplifier is turned on, the discharge of the capacitor is stopped, and operation of the negative feedback circuit is started again. By stopping the operation of the negative feedback circuit by means of the time lag during switching of the MR head as described herein above, the overvoltage applied on the MR head during switching of the MR head can be prevented. By preventing the over voltage, the reliability of the MR head is improved.

What is claimed is:

1. A magnetic recording/reproduction apparatus comprising:
    at least two heads;
    head switching means for controlling the heads so that, while one head is being active, the other head is being inactive;
    a negative feedback circuit having an amplifier for applying a predetermined voltage on said head;
    first switching means for controlling the operation of said amplifier; and
    a current source connected between the output of said amplifier and a predetermined voltage and connected to said amplifier by way of second switching means,
    wherein when said first switching means detects the change of the head switching signal, the first switching means inactivates said amplifier.

2. The magnetic recording/reproduction apparatus as claimed in claim 1, wherein after said amplifier is inactivated, said head switching means is operated.

3. A magnetic recording/reproduction apparatus comprising:
    at least two heads;
    head switching means for controlling the heads so that, while one head is being active, the other head is being inactive;
    a negative feedback circuit having an amplifier for applying a predetermined voltage on said head;
    first switching means for controlling the operation of said amplifier; and
    a current source connected between the output of said amplifier and a predetermined voltage and connected to said amplifier by way of second switching means,
    wherein said first switching means is operated with said second switching means, and
    wherein a capacitor is connected between the output of said amplifier and said predetermined voltage so as to remove the output noise of said amplifier.

4. The magnetic recording/reproduction apparatus as claimed in claim 3, wherein said second switching means becomes conductive while said amplifier is being inactive to discharge the capacitance accumulated in said capacitor.

5. A magnetic recording/reproduction apparatus comprising:
    at least two heads;
    head switching means for controlling the heads so that, while one head is being active, the other head is being inactive;
    a negative feedback circuit having an amplifier for applying a predetermined voltage on said head;
    first switching means for controlling the operation of said amplifier; and
    a current source connected between the output of said amplifier and a predetermined voltage and connected to said amplifier by way of second switching means,
    wherein said head switching means has at least two switching means, one terminal of any one of the switching means is connected to one terminal of said head, the other terminal of said switching means is connected to one input terminal of said amplifier, and means for applying said voltage is connected to the other input terminal of said amplifier.

6. The magnetic recording/reproduction apparatus as claimed in claim 5, wherein one terminal of the other switching means is connected to the control terminal of a transistor connected to said head, and the other terminal of said other switching means is connected to the output of said amplifier.

7. The magnetic recording/reproduction apparatus as claimed in claim 5, wherein one terminal of the other switching means is connected to the control terminal of the transistor having one terminal connected to said head, the other terminal of said other switching means is connected to the output of said amplifier, and a resistor is connected to the other terminal of said transistor.

* * * * *